US006694502B2

(12) United States Patent
Mehrotra et al.

(10) Patent No.: US 6,694,502 B2
(45) Date of Patent: Feb. 17, 2004

(54) DATA STRUCTURE FOR FINE-GRID MULTI-LEVEL VLSI ROUTING AND METHOD FOR STORING THE DATA STRUCTURE IN A COMPUTER READABLE MEDIUM

(75) Inventors: Sharad Mehrotra, Cedar Park, TX (US); Parsotam T. Patel, Austin, TX (US)

(73) Assignee: Sun Microsystems, Inc., Palo Alto, CA (US)

(*) Notice: Subject to any disclaimer, the term of this patent is extended or adjusted under 35 U.S.C. 154(b) by 46 days.

(21) Appl. No.: 10/002,495

(22) Filed: Nov. 2, 2001

(65) Prior Publication Data

US 2003/0088843 A1 May 8, 2003

(51) Int. Cl.⁷ ............................................... G06F 17/50
(52) U.S. Cl. ........................... 716/12; 716/13; 716/14; 716/15
(58) Field of Search ................. 716/5, 6, 7, 12, 716/13, 15; 717/137; 715/503; 709/230; 705/1; 257/750

(56) References Cited

U.S. PATENT DOCUMENTS

| 4,615,011 A | | 9/1986 | Linsker | |
|---|---|---|---|---|
| 4,752,887 A | * | 6/1988 | Kuwahara | ............ 716/15 |
| 4,855,929 A | | 8/1989 | Nakajima | |
| 4,910,680 A | | 3/1990 | Hiwatashi | |
| 4,965,739 A | | 10/1990 | Ng | |
| 5,072,402 A | | 12/1991 | Ashtaputre et al. | |
| 5,483,461 A | | 1/1996 | Lee et al. | |
| 5,583,788 A | | 12/1996 | Kuribayashi | |
| 5,644,500 A | | 7/1997 | Miura et al. | |
| 5,751,596 A | | 5/1998 | Ginetti et al. | |
| 5,768,479 A | | 6/1998 | Gadeldarim et al. | |
| 5,774,371 A | | 6/1998 | Kawakami | |
| 5,838,908 A | * | 11/1998 | Matzke et al. | ............ 709/230 |
| 5,856,927 A | | 1/1999 | Greidinger et al. | |
| 6,202,195 B1 | | 3/2001 | Tanaka et al. | |
| 6,230,304 B1 | | 5/2001 | Groeneveld et al. | |
| 6,442,745 B1 | * | 8/2002 | Arunachalam et al. | ....... 716/13 |

OTHER PUBLICATIONS

Tzeng et al., "Codar: A Congestion–Directed General Area Router", Nov. 1988, Digest of Technical Papers, IEEE, pp. 30–33.*

* cited by examiner

Primary Examiner—Vuthe Siek
Assistant Examiner—Helen Rossoshek
(74) Attorney, Agent, or Firm—Zagorin, O'Brien & Graham LLP

(57) ABSTRACT

Provided is a data structure containing wiring information for an integrated circuit and a method for storing the same in a computer readable medium. In one embodiment of the present invention storage of the data structure is achieved by mapping said integrated circuit into memory locations of said medium as a wiring plane having a plurality of data points arranged in a grid. Each of the plurality of data points having state information associated therewith, which includes a plurality of attributes. Subsections of the grid are associated with memory locations in the computer readable medium to form a plurality of tiles. Specifically the tiles and data points are arranged so that a sub-portion of the data points associated with one of the plurality of tiles have common attributes.

13 Claims, 5 Drawing Sheets

DATA STRUCTURE FOR FINE-GRID MULTI-LEVEL VLSI ROUTING AND METHOD FOR STORING THE DATA STRUCTURE IN A COMPUTER READABLE MEDIUM

BACKGROUND OF THE INVENTION

The present invention relates to integrated circuit design, and more specifically to a data structure and method for routing interconnections between components of an integrated circuit.

An overview of a typical design process for integrated circuits is shown in the flow diagram of FIG. 1. The process can be generally divided into a front-end design phase and a back-end development phase. During the front-end phase, from a set of specifications, the engineer designs and develops a logical representation of the integrated circuit of interest in the form of a schematic, at step 10. The schematic is then entered on computer workstation from which a circuit netlist is generated, at step 12. The netlist defines the entire integrated circuit, including all components and interconnections. Alternatively, the integrated circuit information may be developed using hardware description language (HDL) and synthesis. With the aid of circuit simulation tools available on the workstation, the designer then simulates the functionality of the circuit, at step 14. The circuit simulation process may involve several iterations of design modifications and improvements until the circuit design is finalized.

The back-end development involves several steps during which a final circuit layout (physical description) is developed based on the schematic. During placement step 16, various building blocks (or cells) as defined by the finalized circuit schematic are placed within a predefined floor plan. For integrated circuits designed based on array or standard cell technology, the various circuit building blocks are typically predefined and made available in a cell library. Placement is followed by a routing step 18, during which interconnects between circuit elements are routed throughout the layout. Finally, the accuracy of the layout versus the schematic is verified at step 20, and if no errors or design rule violations are found at step 22, then the circuit layout information is used for the process of fabrication at step 24.

During placement step 106 a plurality of cells are selected from one or more cell libraries and the cell interconnects are determined. For example, groups of cells may be interconnected to functions as flip-flops, shift registers and the like. The routing of wires to interconnect the cells and achieve the aforementioned functions is performed during the routing step 18, typically referred to as conducting paths, wires or nets.

For more complex designs, often at least four distinct layers of conducting medium are made available for routing. These layers include a polysilicon layer and three metal layers (metal-1, metal-2, and metal-3). The polysilicon layer, metal-1, metal-2, and metal-3 are typically employed for vertical and/or horizontal routing. It is a common practice to route each net by using one or more of the distinct layers of conducting medium. One layer of an adjacent pair of layers of conducting medium is typically reserved for connections running along one direction, e.g., the "x" direction, referred to as a preferred wiring direction. The remaining layer of the pair has a preferred wiring direction, which is orthogonal to the "x" direction, i.e., the preferred wiring direction is in the "y" direction. Some of the layers, such as the metal layers, are exclusively used for interconnection of components. The polysilicon layer may have a dual role, such as forming the gates of transistors as well as for interconnection of components. Electrical connections between two nets on adjacent layers is implemented with a "via" which is an etched or drilled hole in the substrate for allowing a conductive path to extend from one layer to another layer.

Conventional design methodologies typically use a two-step process for determining the final size and location of each conducting path during the routing step 18. The first step is the global routing step for roughly determining conducting paths. The "rough" wiring pattern generated in this step is known as a "global route." Subsequently, a second detailed routing step for precisely determining a final routing pattern according to the global routes is used. This final routing pattern determined by the detailed routing step is known as a "detailed route." It is important to entertain certain constraints when routing an integrated circuit. These constraints are arranged in two categories: electrical rules and design rules. Electrical rules concern electrical performance parameters that must be satisfied by the conducting paths, e.g., cross-talk, circuit parasitics and the like. Design rules concern physical parameters that must be satisfied by the conducting paths, e.g., minimum spacing between adjacent wires, minimum wire width and the like. Owing to ever decreasing size of the components on integrated circuits and the increasing complexity of the constraints, computer-aided design (CAD) has become indispensable.

As a result, several algorithms are currently employed to assist in routing nets employing CAD technology. Specifically, the integrated circuit of interest is mapped into a memory of the CAD system. The algorithm searches the information in the memory concerning the integrated circuit in order to define a conductive path between two or more points. The maze algorithm is one of the most widely used algorithms for routing nets due to its superior searching capability. The searching capability afforded by the maze algorithm enables determination of the shortest distance required for net routing. Specifically, the maze algorithm commences at a starting location and expands outwardly therefrom to neighboring locations until the destination is reached, in order to identify a preferring conducting path. However, the processing time of the maze algorithm is long, on the order of a few days to several weeks.

Other algorithms have been employed to reduce the search time for a conducting path between two points. To that end, algorithms such as a hierarchical algorithm, a line search algorithm and a channel router algorithm have been developed. While each of these algorithms reduces the time required to route wires. The drawbacks differ.

To assist in search of a conducting path, the integrated circuit may be mapped into locations of a memory of the CAD system as an imaginary grid of points, referred to as a gridded data structure. The points may be stored as a sparse matrix, i.e., as line intervals in a preferred direction. The grid, or sparse matrix, is employed by the CAD system to route and track the location of the various conducting paths and components that make up the integrated circuit. To that end, status information is stored at each of the data points. The status information includes various attributes, such as data point state information: information concerning the availability of data point to receive a wire, i.e., open, or open with high cost, invalid or blocked. Additional information concerns the data point location in x, y and z coordinates; the net identifier, i.e., which net the data point is associated, the shapedef, the geometric shape of the wire present, as well as the allowed shapeclass and current conducting path cost.

Another technique maps the wiring plane of an integrated circuit into locations of a CAD system memory as a plurality of longitudinal tiles, referred to as a tiled data structure. Electrical components present in the wiring plane, as well as other blockages, are represented as polygonal objects. The tiled data structure requires much less memory to map the integrated circuit, compared to the gridded data structure. However, conducting path searches of the tiled data structure by the various algorithms are slower than the conducting path searches of the gridded data structure.

What is need, therefore, is a technique for routing wires for integrated circuits that is memory efficient.

SUMMARY OF THE INVENTION

Provided is a data structure containing wiring information for an integrated circuit and a method for storing the same in a computer readable medium. In one embodiment of the present invention storage of the data structure is achieved by mapping the integrated circuit into memory locations of the medium as a wiring plane having a plurality of data points arranged in a grid. Each of the plurality of data points has state information associated therewith that includes a plurality of attributes. Subsections of the grid are associated with memory locations in the computer readable medium to form a plurality of tiles. Specifically, the tiles and data points are arranged so that a sub-portion of the data points associated with one of the plurality of tiles have common attributes. In this manner, the common attributes need not be recorded for each data point in a given tile. Rather, the common attributes need only be stored once for each tile. Each data point may be associated with the common attribute, thereby reducing amount of information required to map the integrated circuit into the memory.

This is achieved by reducing the periodicity of the plurality of data points so that a distance between adjacent data points is less than a minimum wiring pitch defined by the design rules. For purposes of the present invention minimum wiring pitch is defined as being the sum of the minimum spacing between adjacent wires and the minimum width of a wire, both of which are measured transversely to a longitudinal axis of the wire. The width of the tiles is selected to be approximately equal to the minimum wiring pitch. As a result the attributes of adjacent data points in a common tile are closely related, if not identical. In an exemplary embodiment, the periodicity of the plurality of data points is selected so that a distance between adjacent data points is less than one half of a minimum wiring pitch. This results in no more than two values for each of the pride points being present in a common tile for the following attributes: shape definition, net identifier and shape classes.

DETAILED DESCRIPTION OF THE INVENTION

Figure 2:
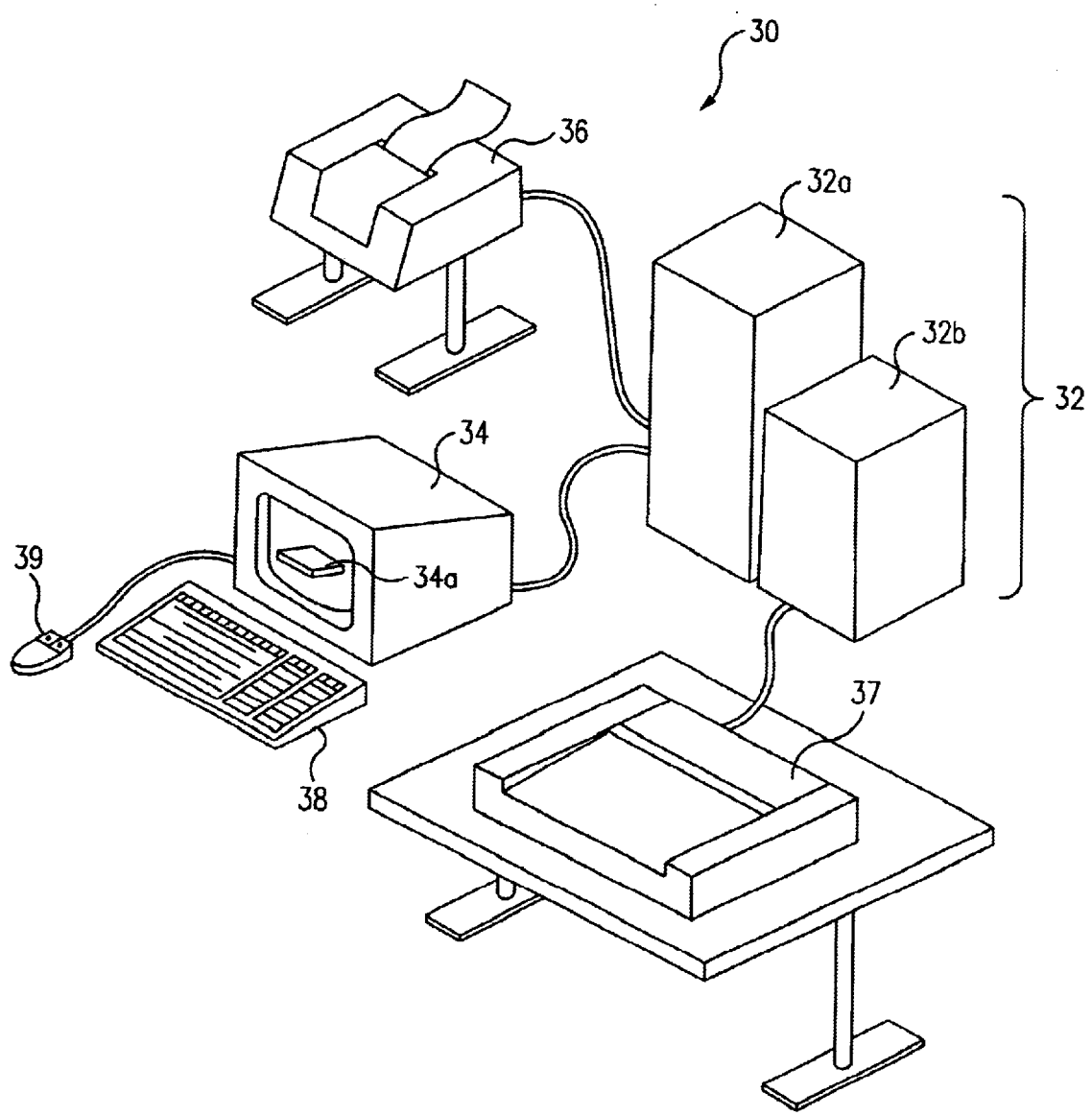
FIG. 2 is perspective view of a system employed to design integrated circuits.

Referring to FIG. 2, a block diagram shows a system 30 employed to design integrated circuits as including a processing unit 32, as well as a display 34, a printer 36, a plotter 37, a keyboard 38 and a pointing device 39, such as a "mouse", all in data communication with processing unit 32. Processing unit 32 is any computer environment known in the art, such as a personal computer (PC), mainframe of networking system, available from manufacturers such as Sun Microsystems, Hewlett-Packard, IBM or Digital Equipment. For purposes of the present invention, processing unit 32 is shown as a work-station that includes a central processor 32a in data communication with a memory 32b. Software tools (not shown) are integrated with processing unit 32 to facilitate designing an integrated circuit 34a.

System 30 may perform the function of each step shown above in FIG. 1 to design integrated circuit 34a. To that end, memory 32b includes a netlist or other computer-readable description of integrated circuit 34a. The netlist includes information concerning interconnections between the terminals (not shown) of integrated circuit 34a. Processor 32a, under control of the software tools (not shown) operates on the netlist to determine an appropriate layout for integrated circuit 34a. This is achieved employing any of the known routing algorithms, which include a maze algorithm or a line search algorithm to find a suitable layout, on a floorplan in accordance with the design rules and electrical rules included in the netlist. A problem overcome by the present invention concerns the great amount of time and memory space required to route the wires, or interconnects, of integrated circuit 34a using standard routing algorithms.

Figure 3:
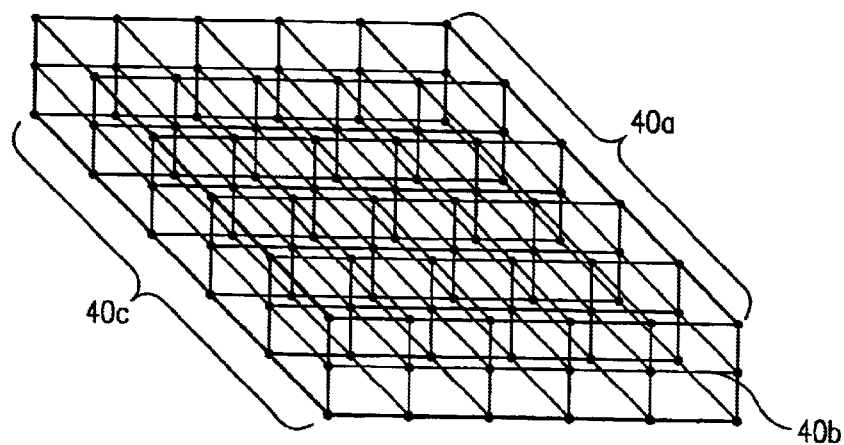
FIG. 3 is a perspective view showing an arrangement of data points into which an integrated circuit is mapped into a memory shown in FIG. 2.

Referring to FIGS. 2 and 3, the present invention overcomes these problems by providing memory 32b with a data structure that is compact in size; yet it contains all the wiring information for integrated circuit 34a. To that end, the data structure is recorded in memory 32b to map integrated circuit 34a as a plurality of wiring planes, three of which are shown as 40a, 40b and 40c. Each of wiring planes 40a, 40b and 40c has a plurality of data points 42 arranged in a grid, shown more clearly in FIG. 4 with respect to wiring plane 40b.

Figure 4:
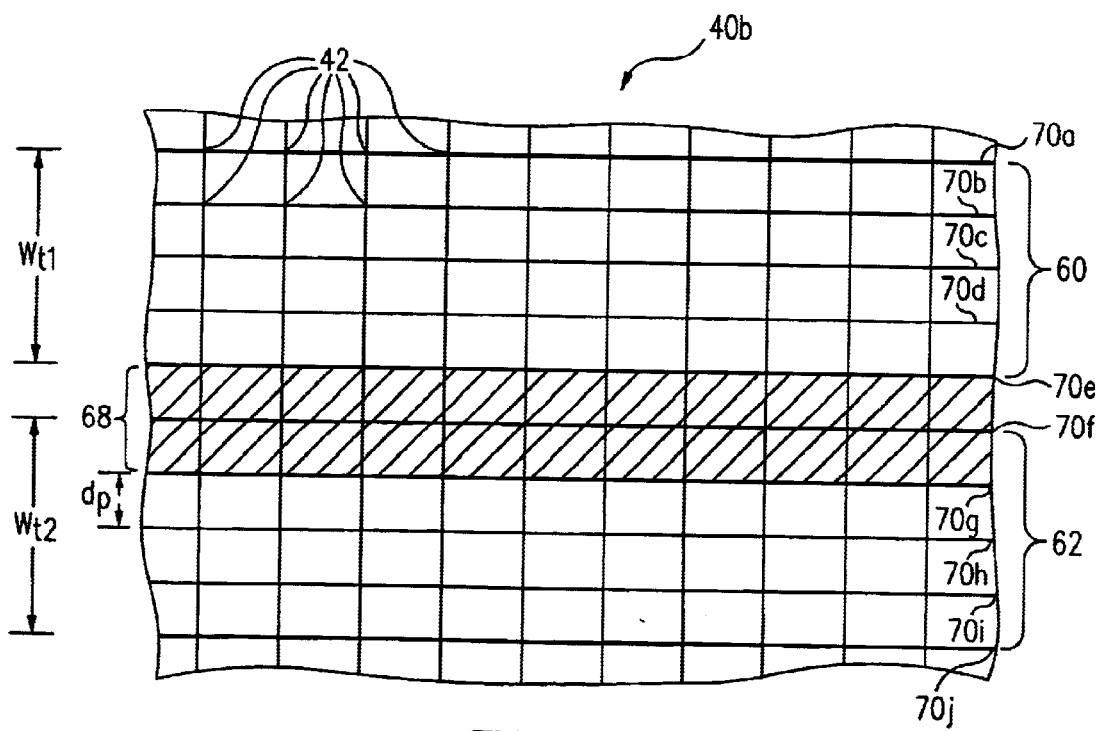
FIG. 4 is a top down view of one wiring plane shown in FIG. 3.
Figure 5:
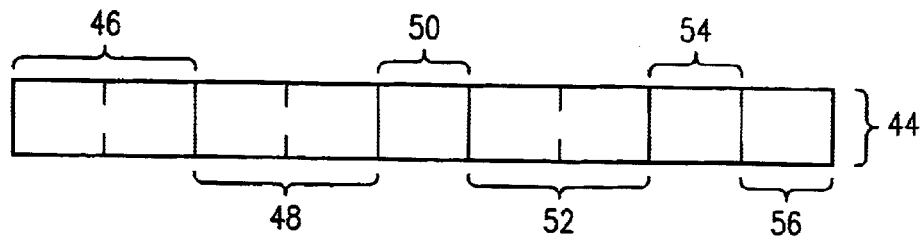
FIG. 5 wiring planes that function as a map of the integrated circuit and is recorded in the memory of FIG. 1, in accordance with the present invention.

Referring to FIGS. 2, 4 and 5, each of the plurality of data points 42 has state information 44 associated therewith. The state information is recorded in memory 32b as a plurality of bits and may have multiple attributes. A common prior art data structure may include a separate field for each attribute. For example, one attribute, referred to as the location attribute, may be recorded in a field 46. The location attribute includes information concerning the x, y position of data point 42 in wiring plane 40. The identifier of wiring plane 40 may define the z position of the data point.

Figure 6:
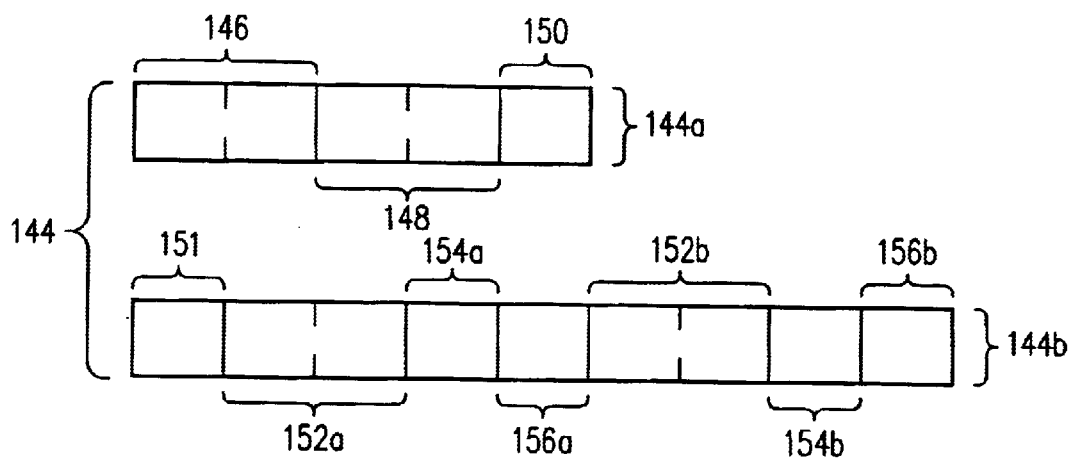
FIG. 6 shows a data structure that is recorded into the memory in FIG. 1 to map an integrated circuit, in accordance with the present invention.
Figure 7:
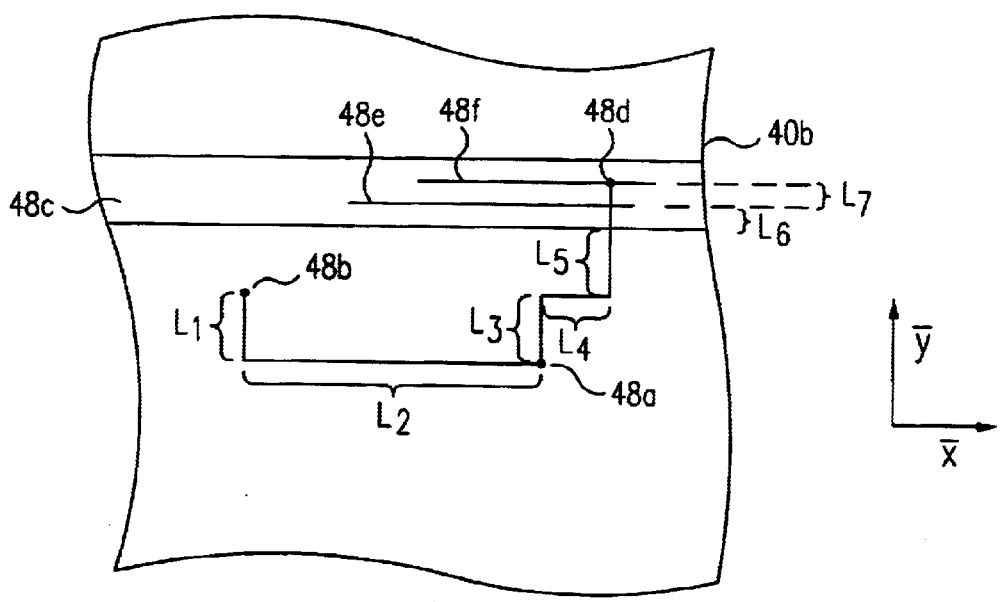
FIG. 7 is a plan view showing the routing of conducting paths in a wiring plane in accordance with one embodiment of the present invention.

Referring to both FIGS. 6 and 7, additional attributes of state information 44 may be recorded in additional fields. For example, field 48 may include information concerning the availability status of data point of interest, shown as 48a in wiring plane 40b, to receive a conducting path at that point, referred to as the status attribute. Examples of the status attribute include indications that data point of interest 48a is open, indicating that a conducting path may be placed on data point 48a, or closed indicating that a conducting path may not be placed on data point 48a, i.e. the data point is blocked by a previous placement of a conducting path. Additionally, the status attribute may contain information indicating that data point of interest 48a is open, and the cost of the of the data point. The cost is the amount of area of the wiring plane that will be occupied by formation of the conducting path from one data point, shown as 48b, to data point of interest 48a and in accordance with both electrical and design rules. The cost could be indicated qualitatively, e.g., high, low and medium. Alternatively, the cost may be indicated quantitatively, e.g., a percentage of the areas of wiring plane 40b or the exact area. The area is determined as a function of the length of the conducting path when traversing between the two aforementioned data points. The path length is measured as a function of the Manhattan length, i.e., the length required to extend a conducting path between two points with all segments of the conducting path extending orthogonally to one of the two directions over which wiring plane 40b extends. As shown, wiring plane 40b extends along two orthogonal directions $\vec{x}$ and $\vec{y}$. All of the segments of the conducting path extending between points 48a and 48b, shown as L1 and L2, are orthogonal to either the $\vec{x}$ or $\vec{y}$ directions, i.e., neither of the segments L1 and L2 form an oblique angle with respect to the directions $\vec{x}$ and $\vec{y}$.

Field 50 may include information concerning the cost of the known conducting path, referred to as a path cost attribute. The path cost attribute contains a known path cost and a future path cost. The known path cost includes information concerning the area of the wiring plane, in this example, wiring plane 40b, that is occupied by the path taking as a function of the Manhattan length and taking into consideration of both the electrical design rules and any obstacles that were present. Obstacles are circuit features occupying areas of the wiring plane that prohibit a conductive path from traversing, e.g., logic gates previous routed conductive paths and the like. The future path cost is the same of the known path cost, excepting that the Manhattan length is determined without consideration of obstacles.

Field 52 may include information concerning the identification of the net that is associated with the data point, referred to as a net identifier attribute, were the data point associated with a wire, i.e., blocked. Field 54 may include information concerning the shape class of the conducting path occupying the data point, referred to as the shapedef attribute. Field 56 may include information concerning the shape of the conducting path that may occupy the data point, referred to as the shapeclasses attribute. Additional fields may be included in state information 44, as needed.

Referring to both FIGS. 2 and 4, the benefits of the data structure of the present invention are provided by reducing the number of attributes that are recorded in memory 32b for each data point 42. This is achieved having subsections of wiring plane 40b associated with memory locations in memory 32b to form a plurality of tiles over wiring plane 40b, two of which are shown as tile 60 and 62. A plurality of data points 42 is associated with each of tile 60 and 62. The width of the tiles 60 and 62 and the distance between adjacent data points 42, both of which are measured orthogonally to the preferred wiring direction, are arranged so that the state information 44 of data points 42 associated with a common tile 60 and 62 are closely related. In this manner, certain attributes of the state information 44 need not be recorded for each data point 42 associated with a tile 60 and 62. Specifically, attributes that are common to multiple data points 42 in a tile 60 and 62 may be recorded once for a tile and correlated to data points 42 associated with the tile.

To ensure that multiple data points 42 share common attributes, the periodicity of data points 42 are selected so that a distance between adjacent data points 42 is less than a minimum wiring pitch, and the size of tiles 60 and 62 are selected to be approximately equal to the minimum wiring pitch. In one example, the design rules call for a minimum distance between adjacent wires of 0.5 micrometer, with the minimum width of the wires being approximately 0.5 micrometer. This provides a minimum wiring pitch of 1.0 micrometer. The periodicity of the data points 42 is selected so that that distance dp between two adjacent grid points is less than ½ of the minimum wiring pitch, i.e. less than 0.5 micrometer. The width of tiles 60 and 62, wt1 and wt2, respectively, is selected to be approximately the same size as the minimum wiring pitch, i.e., 1.0 micrometer. As a result, once a conducting path extends across a plurality of data points 42 in a tile, such as wire 68 shown in tile 62, then at most two shapedef attributes, two net identifier attributes and two shapeclasses attributes will be associated with tile 62. Specifically, wire 68 occupies three rows of data points 42, row 70e, 70f and 70g. Row 70e is included in tile 60, and rows 70f and 70g are included in tile 62. Assume that the distance dp between the rows 70e and 70f is equal to the distance between rows 70f and 70g and is approximately 0.25 micrometer. As a result, the minimum design rules would allow only one more wire to be routed through tile 60, because row 70i is the nearest row of data points 42 through which a wire may be routed while still satisfying the design rules. Similarly, only one additional wire may be routed in tile 60, with the nearest row of grids points 42 that may be occupied being row 70c. Each data point 42 associated with wire 68 would have identical shapedef attributes, net identifier attributes and shapeclasses attributes. Thus, from the foregoing it is seen that each tile 60 and 62 has at most two different values for each of the shapedef attributes, net identifier attributes and shapeclasses attributes associated with all of the data points 42 within tile 60 and 62.

Referring to FIGS. 4 and 6, taking advantage of the aforementioned principles, the data structure 144 of the present invention includes two sets of state information: data point state information 144a and tile state information 144b. Tile state information 144b would consist of multiple bits of information arranged in a plurality of fields shown as fields 151, 152a, 154a, 156a, 152b, 154b and 156b. Field 151 includes information concerning the location of the tile among wiring plane 40b, such as the lower x, y coordinate and the cost information of the tile along the x or y directions. These are referred to as a tile location attribute and a tile cost attribute, respectively. Fields 152a and 152b include information concerning the net identifier attributes of the data points associated with the tile that corresponds to tile state information 144b. Fields 154a and 154b include information concerning the shapedef attributes of the data points associated with the tile that corresponds to tile state information 144b. Fields 156a and 156b include information concerning the shapeclasses attributes of the data points 42 associated with the tile corresponding to tile state information 144b.

The presence of fields 152a, 154a, 156a, 152b, 154b and 156b substantially reduces the amount of information that must be stored for each data point 42 in a wiring plane 40b. Specifically, data point state information may omit the fields associated with the net identifier attributes, the shapedef attribute and the shapeclasses attributes, because this information is already present in the tile state information 144b. Rather, data point state information 144a need only include the location attribute, in field 146 and the status attribute and conducting path cost attribute information in fields 148 and 150, respectively. Arranging the data structure in this manner to describe an integrated circuit 34a substantially reduce the amount of memory required to accurate map the same, because common attributes need not be recorded for each data point 42 in a given tile 60 and 62. In this manner, the amount of information required to map integrated circuit 34a into the memory may be reduced. This is manifest when realizing that the number of data points, ndp, is much greater than the number of tiles, nt. Specifically, the number of data points, ndp, may be an order of magnitude greater than the number tiles, nt. As a result, the data structure in accordance with the present invention substantially reduces the time required for searching conducting paths using either a maze algorithm or a line search algorithm.

To facilitate conducting path searches, tiles, such as 60 and 62, may be recorded in memory 32b to form a contiguous array of tiles by stringing tiles 60 and 62 together by the lower y (or x) coordinate associated with the tile location attribute. The choice of coordinates depends upon the preferred wiring direction for the wiring plane 40b. Upon analyzing a tile, the routing algorithm examines the status attribute of each data point 42 associated with the tile to determine whether the corresponding data point 42 is open or closed. Alternatively, the algorithm may analyze each grid point 42 to determine whether the same is blocked, were a rip-up search performed.

Further reduction in memory requirements may be obtained by implementing line interval notation so that either the x coordinate or y coordinate information may be omitted. In this manner, the amount of information required for the location attribute is reduced.

Referring to both FIGS. 2 and 7, additional reduction may be achieved if the data point costs are stored as offsets to the cost of tile 48c. For example, knowing the cost of conducting paths associated with tile 48c, such as paths 48e and 48f, the cost of a conducting path between data point of interest 48a and data a point 48d may be determined from segment lengths $L_3$, $L_4$, $L_5$ and $L_6$. Considering that the data cost of segment $L_7$ may be derived from the difference in the cost of conducting paths 48e and 48f, it may be said that the length of segment $L_7$ is already known or easily derived. Therefore, the information that need be stored in memory 32b to determine the cost of a conducting path extending between points 48a and 48d is information concerning segments $L_3$, $L_4$, $L_5$ and $L_6$ and a pointer referring to the address storing information concerning tile 48c. From there, the information concerning segment $L_7$ may be determined to obtain the entire cost of the conducting path extending from data point of interest 48a to data point 48d. Since the cost increments are small for a data point within tile 48c, the tile cost may be stored in memory 32b as an integer, the cost of individual points as bit-compressed numbers. As with the information associated with the status attribute for data points associated with a common tile, bits are closely related. Thus, a simple state assignment may be employed to further compress the number of bits required to provide accurate information for the status attribute all the data points associated with a common a tile.

Figure 1:
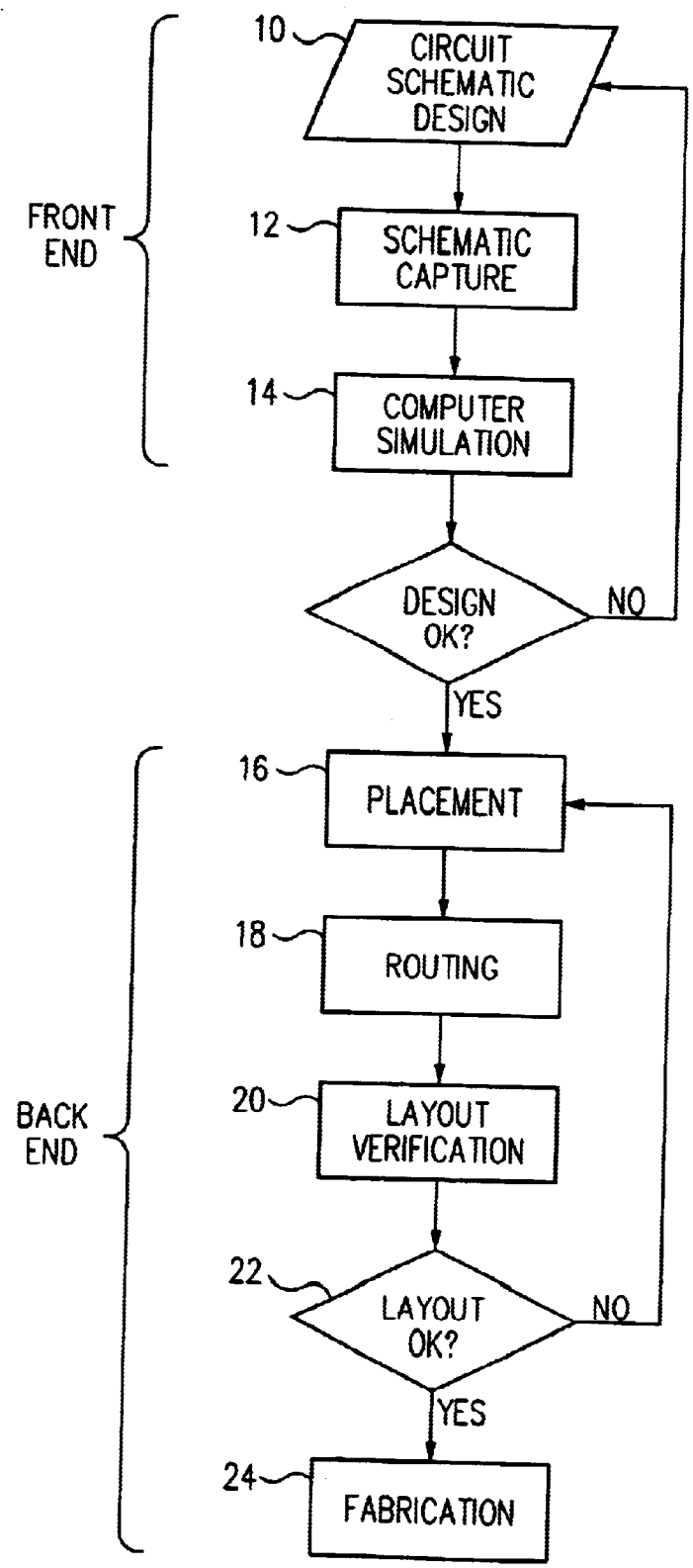
FIG. 1 is a flow diagram of a process for designing integrated circuits.
Figure 8:
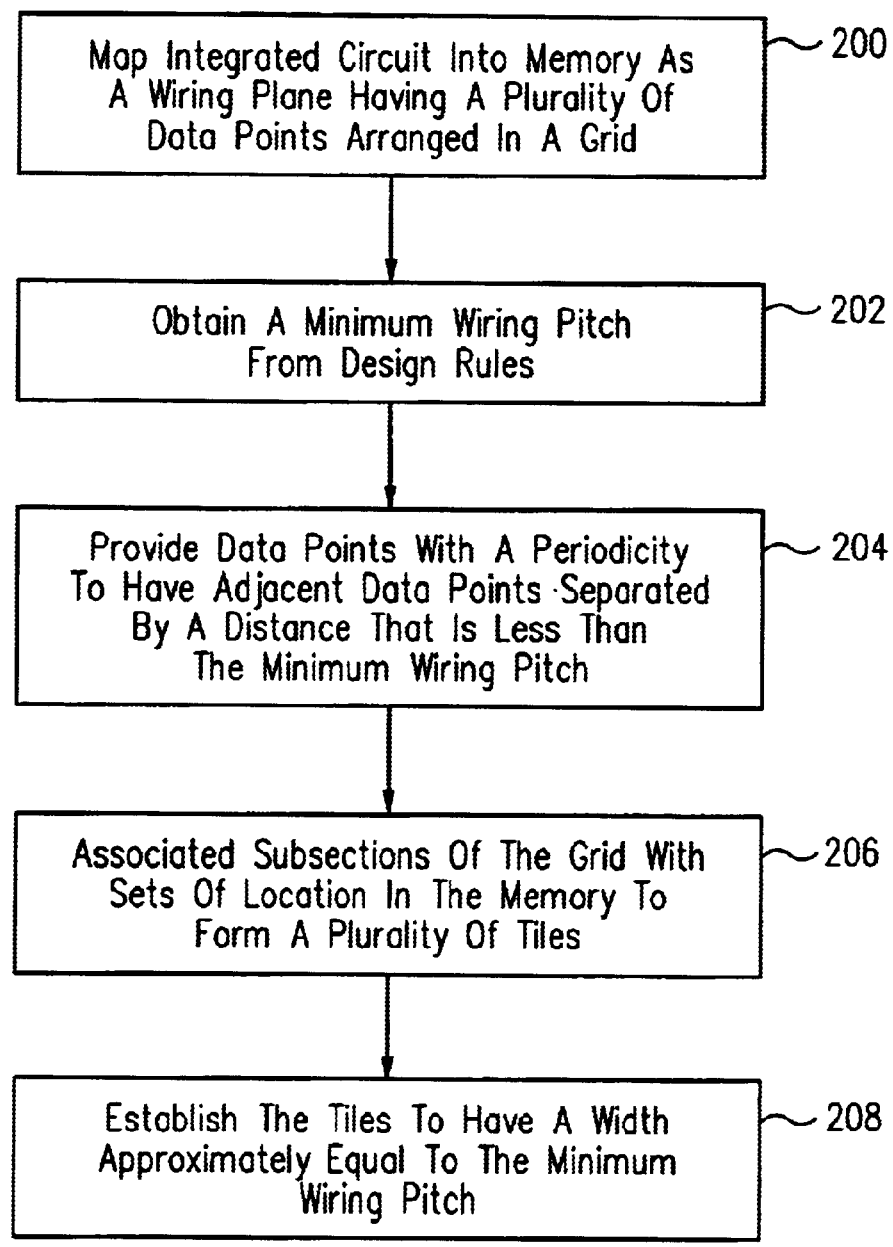
FIG. 8 is a flow diagram showing the steps for storing the data structure, discussed with respect to FIG. 6, into a memory shown in FIG. 2.

Referring to FIGS. 1 and 8, routing to form the data structure in accordance with the present invention integrated circuit 34a is mapped into the memory 32a as wiring plane 40 having a plurality of data points 42 arranged in a grid at step 200. Each of the plurality of data points 42 has state information 144 associated therewith. At step 202 a minimum wiring pitch is ascertained from design rules associated with the integrated circuit 34a being routed. At step 204, the data points are provided with a periodicity that spaces adjacent data points a distance that is less than the minimum wiring pitch. At step 206, subsections of the grid are associated with sets of locations of memory 32a to form a plurality of tiles 60 and 62 so that a sub-portion of data points 42, associated with one of the plurality of tiles 60 and 62 have common attributes. This is achieved by establishing the tiles with a width that is approximately equal to the minimum wiring pitch.

The present invention has been described herein with reference to particular embodiments, but modifications, changes and substitutions are intended in the foregoing disclosure without departing from the scope of the invention as set forth. For example, the periodicity of the data points has been described as being fixed to provide no more than two values far a given attribute. However, the periodicity of the data points may be any desired. Specifically, the periodicity of the data points may be increased so that the distance between adjacent data points decreases and the related attributes of the data points, associated with a common tile, may have a single or common value. Alternatively, the related attributes may include more than two values, were the periodicity between the data points decreased so that the distance between adjacent data points increases. It should be realized, however, increasing the periodicity of the data points requires additional computation power to prevent increase of the time required for routing conducting paths. Conversely, for a fixed amount of computational power, decreasing the periodicity of the data points reduces the time required to route conducting paths.

Additionally, it will be appreciated that in some instances features of the invention will be employed without a corresponding use of other features. For example, the foregoing description discusses mapping an integrated circuit as a grid of data points. The aforementioned integrated circuit may be mapped as a grid of line intervals in lieu of data points. The scope of the invention, therefore, should not be determined from the foregoing. Rather, the scope of the invention should be determined from the claims, including the full scope of equivalents thereof.

What is claimed is:

1. A method for storing, in a computer readable medium, a data structure containing wire routing information of an integrated circuit, said method comprising:

mapping said integrated circuit into memory locations of said memory as a wiring plane having a plurality of data points arranged in a grid, wherein said plurality of data points is provided with a periodicity so that a distance between adjacent data points is less a minimum wire pitch with each of said plurality of data points having a state information associated therewith, said state information including a plurality of attributes; and associating subsections of said grid with sets of said memory locations in said computer readable medium to form a plurality of tiles so that a sub-portion of said data points associated with one of said plurality of tiles have common attributes.

2. The method as recited in claim 1 wherein mapping said integrated circuit into memory locations further includes providing said plurality of data points with a periodicity so that a distance between adjacent data points is less than one half of a minimum wire pitch.

3. The method as recited in claim 1 wherein associating subsections of said grid further includes providing each of said plurality of tiles with a width, $w_t$, that is approximately equal to a minimum wire pitch.

4. The method as recited in claim 1 wherein said common attributes are selected from a set consisting of shape definition, shape class and net identifier.

5. The method as recited in claim 1 wherein said attributes are selected from a set consisting of status, location, net identifies, shape definition, shape class and conducting path cost.

6. The method as recited in claim 1 wherein mapping said integrated circuit further includes mapping said integrated circuit as a plurality of wiring planes, each of which has said plurality of data points arranged in said grid.

7. The method as recited in claim 1 wherein associating subsections of said grid further includes forming said plurality of tiles so that multiple subsets of said plurality of data points associated with one of said plurality of tiles have common attributes, with the common attributes associated with one of said subsets differing from the common attributes associated with the remaining subsets.

8. The method as recited in claim 1 wherein associating subsections of said grid further includes forming said plurality of tiles so that multiple subsets of said plurality of data points associated with one of said plurality of tiles have common attributes, with a number of said subsets being a function of a wire pitch and a periodicity of said plurality of data points.

9. A method for storing, in a computer readable medium, a data structure containing wire routing information of an integrated circuit, said method comprising:

mapping said integrated circuit into memory locations of said medium as a wiring plane having a plurality of data points arranged in a grid with a periodicity so that a distance between adjacent data points is less than a minimum wire pitch, with each of said plurality of data points having state information associated therewith, said state information including a plurality of attributes; and associating subsections of said grid with sets of said memory locations in said computer readable medium to form a plurality of tiles having a width, $w_t$, approximately equal to said minimum wiring pitch so that a sub-portion of said data points associated with one of said plurality of tiles have common attributes.

10. The method as recited in claim 9 wherein said attributes are selected from a set consisting of status, location, net identifies, shape definition, shape class and conducting path cost and said common attributes are selected from a set consisting of shape definition, shape class and net identifier.

11. The method as recited in claim 10 wherein associating subsections of said grid further includes forming said plurality of tiles so that multiple subsets of said plurality of data points associated with one of said plurality of tiles have common attributes, with a number of said subsets being a function of a wire pitch and a periodicity of said plurality of data points.

12. The method as recited in claim 11 wherein the common attributes associated with one of said subsets differing from the common attributes associated with the remaining subsets.

13. The method as recited in claim 12 wherein mapping said integrated circuit further includes mapping said integrated circuit as a plurality of wiring planes, each of which has said plurality of data points arranged in said grid.

* * * * *